United States Patent
Smith et al.

(10) Patent No.: US 8,736,813 B2
(45) Date of Patent: May 27, 2014

(54) EXPOSURE APPARATUS WITH AN ILLUMINATION SYSTEM GENERATING MULTIPLE ILLUMINATION BEAMS

(75) Inventors: Daniel Gene Smith, Oro Valley, AZ (US); Eric Peter Goodwin, Tucson, AZ (US)

(73) Assignee: Nikon Corporation, Tokyo (JP)

( * ) Notice: Subject to any disclaimer, the term of this patent is extended or adjusted under 35 U.S.C. 154(b) by 621 days.

(21) Appl. No.: 12/547,311

(22) Filed: Aug. 25, 2009

(65) Prior Publication Data

US 2010/0053583 A1    Mar. 4, 2010

Related U.S. Application Data

(60) Provisional application No. 61/091,828, filed on Aug. 26, 2008.

(51) Int. Cl.
| G03B 27/54 | (2006.01) |
| G03B 27/72 | (2006.01) |
| G03F 7/20  | (2006.01) |

(52) U.S. Cl.
CPC ........ *G03F 7/70208* (2013.01); *G03F 7/70275* (2013.01)
USPC .................................. 355/67; 355/70; 355/71

(58) Field of Classification Search
CPC .......................... G03F 7/70208; G03F 7/70275
USPC ............. 355/67, 69–71, 75, 53; 356/618, 619
See application file for complete search history.

(56) References Cited

U.S. PATENT DOCUMENTS

| 5,309,198 | A | * | 5/1994  | Nakagawa ............... 355/67 |
| 5,329,335 | A |   | 7/1994  | Wada et al. |
| 5,369,464 | A |   | 11/1994 | Kamon |
| 5,594,587 | A |   | 1/1997  | Komatsuda et al. |
| 5,615,047 | A |   | 3/1997  | Komatsuda et al. |
| 5,713,660 | A |   | 2/1998  | Mori et al. |
| 5,790,239 | A |   | 8/1998  | Komatsuda et al. |

(Continued)

FOREIGN PATENT DOCUMENTS

| JP | 2000-21742 A | 1/2000 |
| JP | 2000-21748 A | 1/2000 |

(Continued)

*Primary Examiner* — Steven H Whitesell Gordon
(74) *Attorney, Agent, or Firm* — Roeder & Broder LLP (57) ABSTRACT

An exposure apparatus (10) for transferring a mask pattern (12A) from a mask (12) to first and second substrates (14A) (14B) includes an illumination system (18) that generates and simultaneously directs a first beam (32A) at the mask pattern (12A) and a second beam (32B) at the mask pattern (12A). Further, the first beam (32A) is spaced apart from the second beam (32B) at the mask pattern (12A). As provided herein, the first beam (32A) directed at the mask (12) creates a first pattern beam (34A) that is transferred to a first substrate location (33A), and the second beam (32B) directed at the mask (12) creates a second pattern beam (34B) that is transferred to a second substrate location (33B). Moreover, the first substrate location (33A) is spaced apart from the second substrate location (33B). With this design, the first pattern beam (34A) can be transferred to the first substrate (14A) and the second pattern beam (34B) can be simultaneously transferred to the second substrate (14B). As a result thereof, the same mask (12) can be used to simultaneously transfer features to two wafers (14A) (14B) to approximately double the throughput capabilities of the exposure apparatus (10).

20 Claims, 5 Drawing Sheets

(56) References Cited

U.S. PATENT DOCUMENTS

| | | |
|---|---|---|
| 5,863,677 A | 1/1999 | Nakao |
| 6,238,852 B1 * | 5/2001 | Klosner ................. 430/396 |
| 6,611,316 B2 | 8/2003 | Sewell |
| 6,778,257 B2 | 8/2004 | Bleeker et al. |
| 7,023,525 B2 | 4/2006 | Bleeker et al. |
| 7,116,400 B2 | 10/2006 | Botma |
| 2007/0013885 A1 | 1/2007 | Loopstra et al. |
| 2007/0013890 A1 | 1/2007 | Loopstra et al. |
| 2007/0013893 A1 | 1/2007 | Loopstra |
| 2007/0013894 A1 | 1/2007 | Loopstra |
| 2007/0153247 A1 | 7/2007 | Nagasaka |
| 2007/0216884 A1 | 9/2007 | Nagasaka |
| 2007/0242244 A1 * | 10/2007 | Nagasaka ................. 355/53 |
| 2007/0242254 A1 | 10/2007 | Nagasaka |
| 2007/0242255 A1 | 10/2007 | Nagasaka |
| 2007/0242363 A1 * | 10/2007 | Noboru et al. ............ 359/618 |
| 2007/0258077 A1 * | 11/2007 | Tanaka et al. ............. 355/71 |
| 2007/0273854 A1 | 11/2007 | Nagasaka |
| 2007/0273858 A1 | 11/2007 | Nagasaka |
| 2007/0279606 A1 | 12/2007 | Nagasaka |
| 2008/0013062 A1 | 1/2008 | Nagasaka |
| 2008/0246932 A1 | 10/2008 | Shigematsu |
| 2008/0259440 A1 | 10/2008 | Omura |
| 2009/0040490 A1 | 2/2009 | Shigematsu et al. |
| 2009/0073407 A1 | 3/2009 | Okita |
| 2009/0086186 A1 | 4/2009 | Muramatsu et al. |
| 2009/0135396 A1 | 5/2009 | Mizuno et al. |
| 2009/0153819 A1 | 6/2009 | Okita |

FOREIGN PATENT DOCUMENTS

| | | |
|---|---|---|
| WO | WO2007/138834 A1 | 12/2007 |
| WO | WO2008/007632 A1 | 1/2008 |
| WO | WO2008/007633 A1 | 1/2008 |
| WO | WO2008/004654 A1 | 10/2008 |

* cited by examiner

EXPOSURE APPARATUS WITH AN ILLUMINATION SYSTEM GENERATING MULTIPLE ILLUMINATION BEAMS

RELATED APPLICATIONS

This application claims priority on U.S. Provisional Application Ser. No. 61/091,828, filed Aug. 26, 2008 and entitled "DOUBLE SLIT ILLUMINATION". As far as is permitted, the contents of U.S. Provisional Application Ser. No. 61/091,828 are incorporated herein by reference.

BACKGROUND

Exposure apparatuses for semiconductor processing are commonly used to transfer features from a reticle onto a semiconductor wafer during semiconductor processing. A typical exposure apparatus includes an illumination source, a reticle stage assembly that positions a reticle, an optical assembly, and a wafer stage assembly that positions a semiconductor wafer. Typically, the wafer is divided into a plurality of rectangular shaped integrated circuits.

There are two kinds of exposure apparatuses that are generally known and currently used. The first kind is commonly referred to as a Stepper lithography system. In a Stepper lithography system, the reticle is fixed (except for slight corrections in position) and the wafer stage assembly moves the wafer to fixed chip sites where the illumination source directs an illumination beam at an entire reticle pattern on the reticle. This causes the entire reticle pattern to be exposed onto one of the chip sites of the wafer at one time. At the time of exposure, the reticle and the wafer are stationary. After the exposure, the wafer is moved ("stepped") to the next site for subsequent exposure. In this type of system, the throughput of the apparatus is largely governed by how quickly the wafer stage assembly accelerates and decelerates the wafer between exposures during movement between sites.

The second kind of system is commonly referred to as a Scanner lithography system. In a Scanner lithography system, the reticle stage assembly moves the reticle concurrently with the wafer stage assembly moving the wafer during the exposure process. With this system, the illumination beam is slit shaped and illuminates only a portion of the reticle pattern on the reticle. With this design, only a portion of the reticle pattern is exposed and transferred to the site on the wafer at a given moment, and the entire reticle is exposed and transferred to the site on the wafer over time as the reticle pattern is moved through the exposure slit. In this type of system, the throughput of the apparatus is largely governed by how quickly the wafer stage assembly accelerates and decelerates the wafer, and how quickly the reticle stage assembly accelerates and decelerates the reticle.

There is a never ending search to increase the throughput in terms of exposures per hour for the exposure apparatuses. With the current exposure apparatuses, assuming that there is sufficient light to adequately expose the wafer, in order to gain higher throughput, it is necessary to move the wafer and/or reticle at higher speeds, and accelerations. Unfortunately, it is not always easy to merely increase the velocities and accelerations of the wafer and the reticle.

SUMMARY

The present invention is directed to an exposure apparatus for transferring a mask pattern from a mask to at least one substrate. In one embodiment, the illumination system generates and simultaneously directs a first beam at the mask pattern and a second beam at the mask pattern, and the first beam is spaced apart from the second beam at the mask pattern. In this embodiment, the illumination system directs two separate beams at the same mask pattern. As provided herein, the first beam directed at the mask creates a first pattern beam that is transferred to a first substrate location and the second beam directed at the mask creates a second pattern beam that is transferred to a second substrate location. Further, the first substrate location is spaced apart from the second substrate location. With this design, the first pattern beam can be transferred to a first substrate through a first imaging optical path and the second pattern beam can be simultaneously transferred to a second substrate through a second imaging optical path where the two imaging optical paths may share some lens elements. As a result thereof, the same mask can be used to simultaneously transfer features to multiple wafers. Further, as a result thereof, the throughput capabilities of the exposure apparatus can be approximately doubled.

In one embodiment, the illumination system includes an illumination source that generates a source beam, and an illumination optical assembly that separates the source beam into the first beam and the second beam. In this embodiment, the illumination optical assembly can include a segmented imaging condenser that homogenizes the source beam and a diffraction grating positioned near the segmented imaging condenser that separates the source beam into the first beam and the second beam.

In another embodiment, the illumination system includes (i) a first illumination source that generates a first source beam, (ii) a second illumination source that generates a second source beam, and (iii) an illumination optical assembly that guides both of the source beams.

In still another embodiment, the illumination system includes an illumination source that generates a source beam, and a beam separator that separates the source beam into the first beam and the second beam.

The present invention is also directed to a method for manufacturing a first wafer and a second wafer that includes the steps of providing a first substrate, providing a second substrate, transferring the mask pattern to the first substrate, and transferring the mask pattern to the second substrate.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
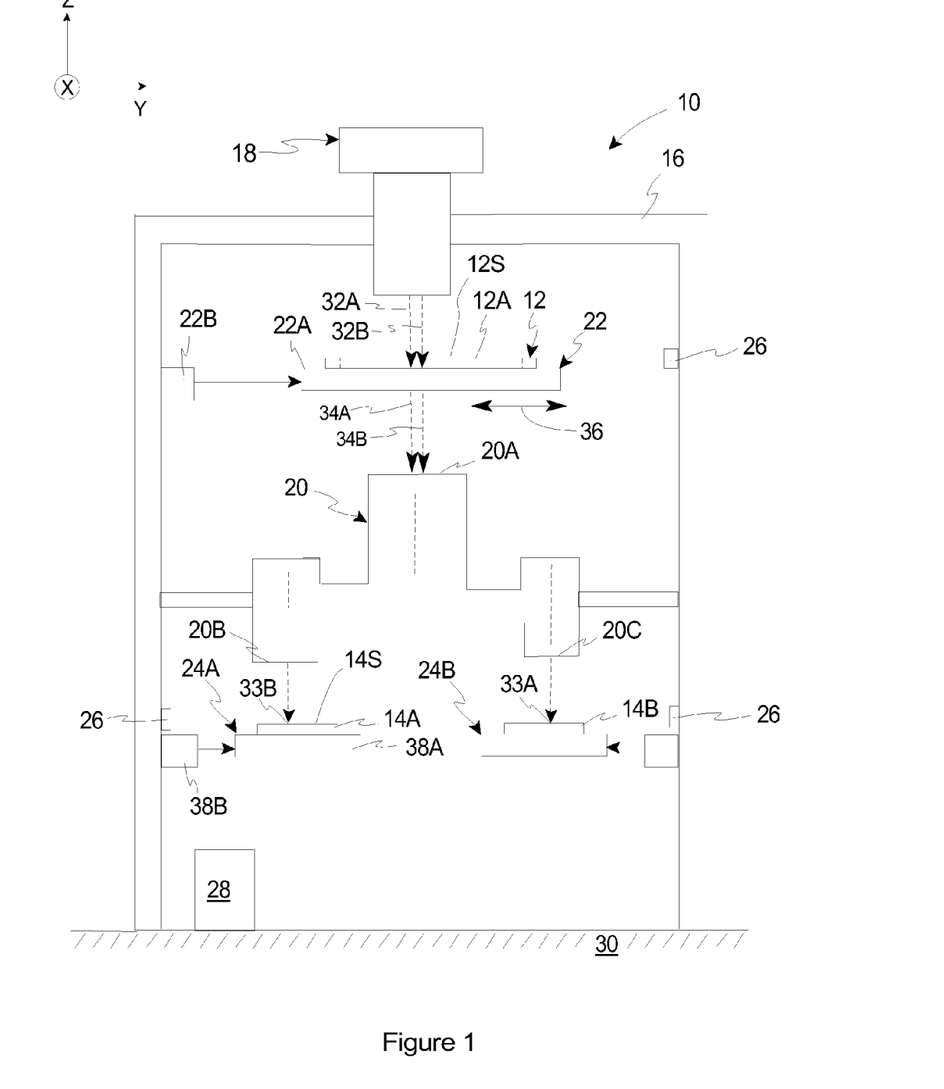
FIG. 1 is a schematic illustration of an exposure apparatus having features of the present invention.

FIG. 1 is a schematic illustration of a precision assembly, namely an exposure apparatus 10 that simultaneously transfers features from a mask 12 (e.g. a reticle) to a first substrate 14A such as a first semiconductor wafer and a second substrate 14B such as a second semiconductor wafer. The design of the exposure apparatus 10 can be varied to achieve the desired throughput, and quality and density of the features on the substrates 14A, 14B. In FIG. 1, the exposure apparatus 10 includes an apparatus frame 16, an illumination system 18 (irradiation apparatus), a projection optical assembly 20, a mask stage assembly 22, a first substrate stage assembly 24A, a second substrate stage assembly 24B, a measurement system 26, and a control system 28. Further, the exposure apparatus 10 mounts to a mounting base 30, e.g., the ground, a base, or a floor, or some other supporting structure.

As an overview, in certain embodiments, the illumination system 18 is uniquely designed to simultaneously generate a first beam 32A (illustrated with an arrow) and a second beam 32B (illustrated with an arrow) that is spaced apart from the first beam 32A that are both directed at the mask 12. With this design, different portions of a mask pattern 12A of the mask 12 can be simultaneously transferred to two separate substrate locations 33A, 33B. This can allow for higher overall throughput for the exposure apparatus 10.

A number of Figures include an orientation system that illustrates an X axis, a Y axis that is orthogonal to the X axis, and a Z axis that is orthogonal to the X and Y axes. It should be noted that any of these axes can also be referred to as the first, second, and/or third axes.

The exposure apparatus 10 discussed herein is particularly useful as a photolithography system for semiconductor manufacturing that transfers features from the reticle 12 to two wafers 14A, 14B simultaneously. However, the exposure apparatus 10 provided herein is not limited to a photolithography system for semiconductor manufacturing. The exposure apparatus 10, for example, can be used as an LCD photolithography system that exposes a liquid crystal display device pattern onto multiple rectangular glass plates or a photolithography system for manufacturing multiple thin film magnetic heads.

In one embodiment, the exposure apparatus 10 is a scanning type system in which the mask pattern 12A is transferred to two substrates 14A, 14B while the mask 12 and the substrates 14A, 14B are being moved. In this design, during exposure, the mask stage assembly 22 moves the mask 12 concurrently with the first substrate stage assembly 24A moving the first substrate 14A, and the second substrate stage assembly 24B moving the second substrate 14B. With this system, each illumination beam 32A, 32B is generally slit shaped and illuminates only a portion of the mask pattern on the mask 12 at a particular time. As a result thereof, at any given moment, a first portion of the mask pattern 12A is exposed and transferred to a site on the first substrate 14A, and a second portion of the mask pattern 12A is exposed and transferred to a site on the second substrate 14B. Further, the entire mask 12 is exposed and transferred to the respective site on the substrates 14A, 14B over time as the mask 12 is moved relative to the beams 32A, 32B. After the entire site of each substrate 14A, 14B is exposed, (i) the substrate stage assemblies 24A, 24B decelerate the substrates 14A, 14B and subsequently accelerate the substrates 14A, 14B in the opposite direction (from which it was previously moving) during movement of the substrates 14A, 14B to the next site, and (ii) the mask stage assembly decelerates the mask 12 and subsequently accelerates the mask 12 in the opposite direction (from which it was previously moving) during the exposure of the next site on each substrate 14A, 14B.

It should be noted that depending upon the design of the projection optical assembly 20, the mask 12 can be moved in the same direction as the substrates 14A, 14B or in the opposite direction as the substrates 14A, 14B during the exposure of the sites. Basically, the substrates 14A, 14B are moved to coincide with the motion of the image of the mask 12.

The apparatus frame 16 is rigid and supports the components of the exposure apparatus 10. The apparatus frame 16 illustrated in FIG. 1 supports the mask stage assembly 22, the projection optical assembly 20, the illumination system 18, and the substrate stage assemblies 24A, 24B above the mounting base 30. Alternatively, one or more of these components can be independently suspended.

A number of different illumination systems 18 are disclosed herein. In each embodiment, the illumination system 18 emits at least two illumination beams 32A, 32B (irradiation) of light energy at the mask 12. Suitable illumination systems 18 are described in more detail below.

In the non-exclusive embodiment illustrated in FIG. 1, the illumination beams 32A, 32B are directed in a generally downward direction along the Z axis at the mask 12. Generally, the two beams 32A, 32B illuminate the mask with a range of angles simultaneously. The range and distribution of angles is determined by the design of the illumination system 18. When the illumination is averaged over the range of angles it should be approximately the same for both beams 32A, 32B, and generally normal incidence for a transmissive mask 12.

In FIG. 1, the mask 12 is at least partly transparent, and the illumination beams 32A, 32B are transmitted through the mask 12. With this design, the first illumination beam 32A illuminates the mask 12 to generate a first pattern beam 34A (e.g. images from the mask 12) directed at the first substrate location 33A that exposes the first substrate 14A, and the second illumination beam 32B illuminates the mask 12 to generate a second pattern beam 34B (e.g. images from the mask 12) directed at the second substrate location 33B that exposes the second substrate 14B.

Alternatively, the mask 12 can be reflective, and the beams 32A, 32B can be directed at the mask 12 and reflected off of the mask 12.

The projection optical assembly 20 projects and/or focuses the pattern beams 34A, 34B from the mask 12 to the substrates 14A, 14B. Depending upon the design of the exposure apparatus 10, the projection optical assembly 20 can magnify or reduce the pattern beams 34A, 34B. In one non-exclusive embodiment, the projection optical assembly 20 reduces the pattern beams 34A, 34B by a reduction factor of four.

In certain embodiments, the projection optical assembly 20 includes (i) a projection inlet 20A where the pattern beams 34A, 34B enter the projection optical assembly 20, (ii) a first projection outlet 20B in which the first pattern beam 34A exits the projection optical assembly 20 directed at the first substrate 14A, and (iii) a second projection outlet 20C in which the second pattern beam 34B exits the projection optical assembly 20 directed at the second substrate 14B. In FIG. 1, the pattern beams 34A, 34B are spaced apart when they enter the projection optical assembly 20.

In one embodiment, the first pattern beam 34A is transferred to the first substrate 14A, e.g., to a substrate surface 14S of the first substrate 14A, through a first imaging optical path and the second pattern beam 34B is simultaneously transferred to the second substrate 14B, e.g., to a substrate surface 14S of the second substrate 14B, through a second imaging optical path and the two imaging optical paths may share some lens elements.

In the embodiment illustrated in FIG. 1, projection optical assembly 20 is designed with a negative magnification and as a result thereof, the first pattern beam 34A is imaged to the right second substrate 14B and the second pattern beam 34B is imaged to the left first substrate 14A. Alternatively, the projection optical assembly 20 can be designed so that the first pattern beam 34A is imaged to the left first substrate 14A and the second pattern beam 34B is imaged to the right second substrate 14B.

A more complete discussion of suitable projection optical assemblies 20 is disclosed in concurrently filed application Ser. No. 12/547,086, entitled "High NA Catadioptric Imaging Optics For Imaging A reticle to a Pair of Imaging Locations", filed on Aug. 25, 2009, with applicants David M. Williamson, Michael B. Binnard, Douglas C. Watson, which is assigned to the assignee of the present invention, and is incorporated by reference herein as far as permitted.

The mask stage assembly 22 holds and positions the mask 12. In one embodiment, the mask 12, e.g., a mask surface 12S of the mask 12, is scanned while the mask 12 is moved by the mask stage assembly 22 along a mask scan axis 36 (e.g. the Y axis in FIG. 1) relative to the illumination system 18, the projection optical assembly 20, and the substrates 14A, 14B. The mask stage assembly 22 can include (i) a mask stage 22A having a chuck (not shown) for holding the mask 12, and (ii) a mask stage mover 22B that moves and positions the mask stage 22A and the mask 12. The mask stage mover 22B can include one or more linear motors, rotary motors, planar motors, voice coil actuators, or other type of actuators. In one embodiment, the mask stage assembly 22 can move the mask 12 along the X axis, along the Y axis, and about the Z axis. Alternatively, for example, the mask stage assembly 22 could be designed to move the mask 12 with more than three degrees of freedom, or less than three degrees of freedom.

The first substrate stage assembly 24A holds and positions the first substrate 14A with respect to the first pattern beam 34A, and the second substrate stage assembly 24B holds and positions the second substrate 14B with respect to the second pattern beam 34B. Each substrate stage assembly 24A, 24B can include (i) a substrate stage 38A having a chuck (not shown) for holding the respective substrate 14A, 14B, and (ii) a substrate stage mover 38B that moves and positions the respective substrate stage 38A and the respective substrate 14A, 14B. For example, each substrate stage mover 38B can include one or more linear motors, rotary motors, planar motors, voice coil actuators, or other type of actuators.

In one embodiment, each substrate stage assembly 24A, 24B can move the respective substrate 14A, 14B along the Y axis, along the X axis, and about the Z axis. Alternatively, for example, each substrate stage assembly 24A, 24B could be designed to move the respective substrate 14A, 14B with more than three degrees of freedom, or less than three degrees of freedom. In the embodiment illustrated in FIG. 1, the substrate stage assembly 24A, 24B moves the respective substrate 14A, 14B along the Y axis during scanning of the sites and moves the respective substrate 14A, 14B along the X and/or Y axes while stepping in between scanning of the sites.

The measurement system 26 monitors movement of the mask 12 and the substrates 14A, 14B relative to the projection optical assembly 20 or some other reference. With this information, the control system 28 can control the mask stage assembly 22 to precisely position the mask 12, and the substrate stage assembly 24A, 24B to precisely position the substrates 14A, 14B. For example, the measurement system 26 can utilize multiple laser interferometers, encoders, and/or other measuring devices.

The control system 28 is connected to the mask stage assembly 22, the substrate stage assemblies 24A, 24B, and the measurement system 26. The control system 28 receives information from the measurement system 26, and controls the stage assemblies 22, 24A, 24B. The control system 28 can include one or more processors and circuits. In FIG. 1, the control system 28 is illustrated as a single unit. It should be noted that in alternative embodiments the control system 28 can be designed with multiple, spaced apart controllers.

Figure 2:
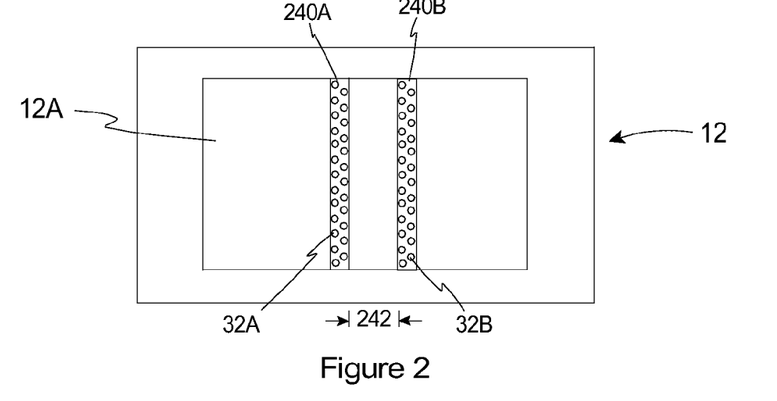
FIG. 2 is a simplified illustration of an illuminated mask.

FIG. 2 is a simplified top illustration of the mask 12 including the mask pattern 12A (illustrated as a box) that includes the features that are to be transferred to the substrates 14A, 14B (illustrated in FIG. 1). FIG. 2 further illustrates that a first mask location 240A of the mask pattern 12A is currently being illuminated by the first illumination beam 32A (illustrated with a box filled with "o's") and that a second mask location 240B of the mask pattern 12A is currently being illuminated by the second beam 32B (illustrated with a box filled with "o's"). In this embodiment, each illumination beam 32A, 32B is generally slit shaped and illuminates only a portion of the mask pattern 12A at any given moment.

The dimensions of each slit shaped illumination beam 32A, 32B can be varied to suit the size of the sites on the substrates 14A, 14B. In one non-exclusive embodiment, each slit shaped illumination beam 32A, 32B has a width of approximately 20 millimeters (along the scan direction) and a length of approximately 132 millimeters.

As provided herein, the position where the first illumination beam 32A is incident on the mask 12 is spaced apart a separation distance 242 (in the short dimension of the slit) from where the second illumination beam 32B is incident on the mask 12. As non-exclusive examples, the separation distance 242 is at least approximately 10 mm, 15 mm, 20 mm, 25 mm, or 30 mm.

Figure 3:
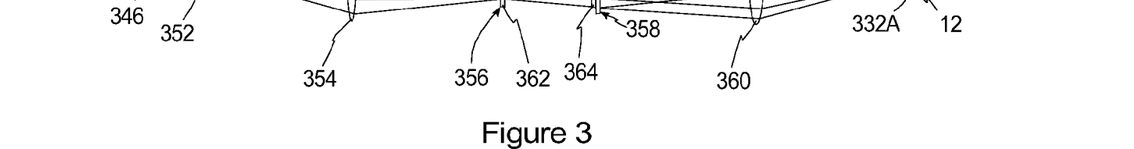
FIG. 3 is a simplified side illustration of a first embodiment of an illumination system having features of the present invention.

FIG. 3 is a simplified side illustration of a first embodiment of an illumination system 318 that can be used in the exposure apparatus 10 of FIG. 1 to generate the first beam 332A (only a portion is illustrated in FIG. 3) and the second beam 332B (only a portion is illustrated in FIG. 3) that are simultaneously directed at two portions of the same mask 12. In this embodiment, the beams 332A, 332B illuminate the bottom of the mask 12.

In this embodiment, the illumination system 318 includes (i) an illumination source 346 that emits a source beam 348 (illustrated with three arrows) of energy, and (ii) an illumination optical assembly 350. The design of these components can be varied to achieve the desire performance of the illumination system 318. In FIG. 3, the illumination source 346 and the illumination optical assembly 350 are aligned along a system axis 351. Alternatively, for example, the illumination source 346 can be angled relative to the illumination optical assembly 350 or portions thereof.

As non-exclusive examples, the illumination source 346 can be a g-line source (436 nm), an i-line source (365 nm), a KrF excimer laser (248 nm), an ArF excimer laser (193 nm), an $F_2$ laser (157 nm), or an EUV light source (13 nm). In FIG. 3, the source beam 348 is directed from the illumination source 346 along and symmetrical with the system axis 351.

In FIG. 3, the illumination optical assembly 350 receives the source beam 348 and focuses and divides the source beam 348 to create the two illumination beams 332A, 332B directed at the mask 12. In this embodiment, the illumination optical assembly 350 includes a diffractive optical assembly 352, a collector optical assembly 354, a segmented imaging condenser assembly 356, a beam divider 358, e.g. a diffraction grating, and a condenser optical assembly 360. The design of these components can be varied according to the wavelength of the source beam 348 and the desired illumination conditions.

The diffractive optical assembly 352 includes one or more diffractive optical elements (only one is illustrated in FIG. 3) that produce the appropriate pupil fill.

The collector optical assembly 354 includes one or more optical elements (only one is illustrated in FIG. 3) that collect the rays that exit the diffractive optical assembly 352 and focus the rays on the segmented imaging condenser assembly 356. The diffractive optical assembly 352 is placed in or near the front focal plane of the collector optical assembly 354 and a first fly's eye 362 is placed in the back focal plane of the collector optical assembly 354. Additionally, it should be noted that the diffractive optical assembly 352 and the collector optical assembly 354 can be referred to herein individually and/or collectively as an "input optical assembly".

The segmented imaging condenser assembly 356 is used to homogenize the beam and generate a generally rectangular shaped beam on the reticle plane that is subsequently divided in this example. The segmented imaging condenser assembly 356 is also known as a fly's eye lens assembly or double fly's eye lens assembly. In FIG. 3, the segmented imaging condenser assembly 356 includes the first lenslet array 362 and a second lenslet array 364. In this embodiment, the lenslet arrays 362, 364 are separated by (approximately) their common focal length. However, in some embodiments, they may not share the exact same focal length.

In this embodiment, each lenslet array 362, 364 includes a plurality of individual lens 366 that are aligned in a two dimensional array. The number and shape of the lenses 366 can be varied to achieve the desired characteristics of the segmented imaging condenser assembly 356. For example, each of the lenses 366 can be generally rectangular shaped. As non-exclusive examples, each lenslet array 362, 364 can include hundreds, hundreds of thousands, or more lenses 366, but 30,000 lenses may be a typical number in an ArF illumination system.

Typically, during operation of the illumination system 318, all of the lenses of each lenslet array 362, 364 is simultaneously illuminated.

As shown in FIG. 3, the first lenslet array 362 images the diffractive optical assembly 352 onto the second lenslet array 364, the second lenslet array 364 images each lens 366 of the first lenslet array 362 to infinity. The final lens (the condenser lens) then produces overlapping images of the elements in the first lenslet array 362. For this reason, the shape of the apertures of the first lenslet array 362 determines the shape of the illumination pattern at the mask 12.

An additional discussion of a suitable segmented imaging condenser assembly 356 is provided in U.S. Pat. No. 5,613,660 issued to Mori et al.; U.S. Pat. No. 5,790,239 issued to Komatsuda et al.; U.S. Pat. No. 5,594,587 issued to Komatsuda et al.; and U.S. Pat. No. 5,615,047 issued to Komatsuda et al., the contents of these patents are incorporated by reference herein as far as permitted.

The diffraction grating 358 divides the beam into two separate beams. In this embodiment, the diffraction grating 358 is an optical element having a regular pattern which diffracts and splits the beam into several beams travelling in different directions. The spacing of the grating can be varied to change the direction of the beams.

In this embodiment, the grating 358 is positioned near, e.g. just before or after the second lenslet array. Alternatively, the grating 358 can be positioned at any of its conjugates following the second lenslet array 364.

In one embodiment, the grating 358 is a sinusoidal phase grating and the pitch of the sinusoidal phase grating 358 is chosen to produce the required separation between +1 and −1 orders to give the needed separation between the slit images. With this type of grating 358, the same number of overlapping images is generated for each slit shaped beam 332A, 332B and the speckle contrast remains at the same level. Further, with this design, the grating 358 divides the light exiting each of the lenses 366 of the second lenslet array 364. As a result thereof, each of the beams 332A, 332B is more homogeneous.

In another embodiment, the grating 358 can be a square wave instead of sinusoidal, or some other approximation to a sinusoid, but at the expense of possible diffraction efficiency. In this embodiment, the grating profile can be adjusted so that most of the light ends up in the +1 and −1 orders. Further, in this embodiment, the generated light that is not the +1 and −1 orders may have to be captured and kept from inappropriately arriving at the reticle 12 as stray light, and this may require a simple relay system.

One non-exclusive example of the required pitch of the grating 358 for a condenser optical assembly 360 having a 200 millimeter focal length, a source beam 348 having a wavelength of 193 nanometers, and two slit images separated by one slit width of 5 millimeters is provided. More specifically, the required pitch is approximately 2 micrometers as calculated below.

$$d \approx \frac{\lambda f}{h} = \frac{193 \text{ nm} \cdot 200 \text{ mm}}{4 \times 5 \text{ mm}} = 1.93 \text{ μm}$$

Making the focal length of the condenser optical assembly 360 longer can help the matter.

In yet another embodiment, the beam divider 358 can be replaced with an array of prisms placed just before or just after the second lenslet array 364, where every other prism is oriented to send light to one of the beams or the other. This approach has the advantage of being very light efficient since no light is lost to unwanted diffraction orders. Also, because each lenslet only illuminates one of the slits, the pupil distributions for the two slits would be slightly different, and would have half the number of degrees of freedom, and thus produce more speckle.

The condenser optical assembly 360 includes one or more optical elements (only one is illustrated in FIG. 3) that collect the rays that exit the grating 358 and focus the rays on the mask 12. In this embodiment, the condenser optical assembly 360 is placed at or near the back focal plane of the first lenslet array 362.

In the embodiment illustrated in FIG. 3, the beams 332A, 332B produced by the illumination system 318 are telecentric. With this design, the bundles of rays of the beams 332A, 332B reaching each point on the reticle 12 are symmetric through a line perpendicular to the reticle plane. Further, the illumination system 318 illuminates two slits with the same pupil condition (preferably identical pupil conditions) while maintaining uniformity of irradiance.

Additionally, in FIG. 3, arrows 368 illustrates that the second lenslet array 364 is the conjugate of the diffractive optical element 352, and arrows 370 illustrates that the mask 12 is the conjugate of the first lenslet array 362.

Figure 4:
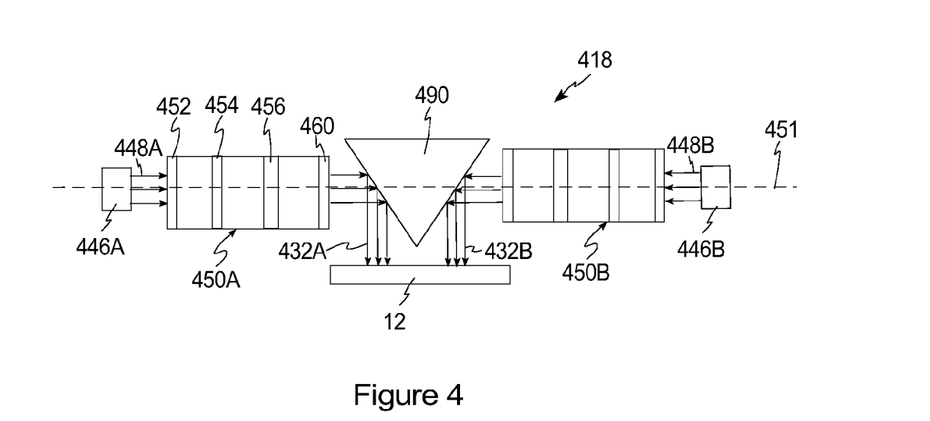
FIG. 4 is a simplified side illustration of another embodiment of an illumination system having features of the present invention.

FIG. 4 is a simplified side illustration of another embodiment of an illumination system 418 that can be used in the exposure apparatus 10 of FIG. 1 to generate the first beam 432A and the second beam 432B that are simultaneously directed at two portions of the same mask 12. In this embodiment, the illumination system 418 includes (i) a first illumination source 446A that emits a first source beam 448A (illustrated with three arrows) of energy, (ii) a first illumination optical assembly 450A that directs and focuses the first source beam 448A, (iii) a second illumination source 446B that emits a second source beam 448B (illustrated with three arrows) of energy, (iv) a second illumination optical assembly 450B that directs and focuses the second source beam 448B, and (v) a V shaped mirror 490 (also referred to as a "redirector") that redirects the beams 432A, 432B at the mask 12. In FIG. 4, the illumination sources 446A, 446B and the illumination optical assemblies 450A, 450B are aligned along the system axis 451. Further, in FIG. 4, the illumination beams 432A, 432B are directed along and symmetrical with the system axis 451, and the V mirror 490 redirects the beams 432A, 432B approximately ninety degrees at the same mask 12.

In this embodiment, the illumination system 418 includes basically two separate illumination systems to produce two illumination beams 432A, 432B that are then directed side-by-side using the V-mirror 490 and sent down a common optical path (relay lens) to the reticle 12.

Moreover, in this embodiment, the illumination sources 446A, 446B are similar to the illumination source 346 described above and illustrated in FIG. 3. Additionally, each of the illumination optical assemblies 450A, 450B is similar to the illumination optical assembly 350 described above and illustrated in FIG. 3 without the grating. Thus, in this embodiment, each of the illumination optical assemblies 450A, 450B includes a diffractive optical assembly 452 (illustrated as a box), a collector optical assembly 454 (illustrated as a box), a segmented imaging condenser assembly 456 (illustrated as a box), and a condenser optical assembly 460 (illustrated as a box) that are similar to corresponding components described above.

Figure 5:
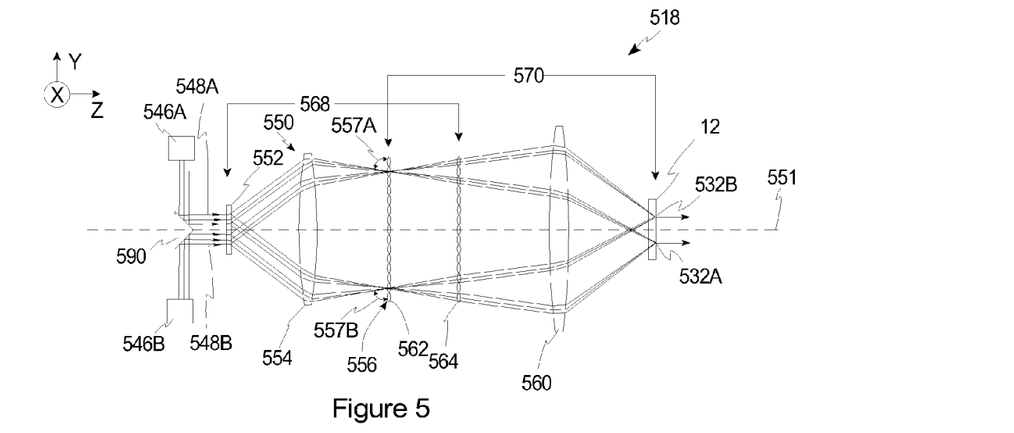
FIG. 5 is a simplified side illustration of a yet another embodiment of an illumination system having features of the present invention.

FIG. 5 is a simplified side illustration of a yet another embodiment of an illumination system 518 that can be used in the exposure apparatus 10 of FIG. 1 to generate the first beam 532A and the second beam 532B that are simultaneously directed at two portions of the same mask 12. In this embodiment, the illumination system 518 includes (i) a first illumination source 546A that emits a first source beam 548A (illustrated with three arrows) of energy transverse to the system axis 551, (ii) a second illumination source 546B that emits a second source beam 548B (illustrated with three arrows) of energy transverse to the system axis 551, (iii) an illumination optical assembly 550 that directs and focuses the source beams 548A, 548B, and (iv) a V shaped mirror 590 (also referred to as a "redirector") that redirects the beams 532A, 532B approximately ninety degrees at the illumination optical assembly 550.

In FIG. 5, the illumination sources 546A, 546B are transverse to the system axis 551 and the illumination optical assembly 550 is aligned along the system axis 551. Further, in FIG. 5, (i) the source beams 548A, 548B, i.e. the first source beam 548A and the second source beam 548B, enter the illumination optical assembly 550 substantially parallel to and spaced apart on opposite sides of the system axis 551, and (ii) the illumination beams 532A, 532B, i.e. the first illumination beam 532A (also referred to herein simply as the "first beam") and the second illumination beam 532B (also referred to herein simply as the "second beam"), exit the illumination optical assembly 550 on opposite sides of the system axis 551.

In this embodiment, the illumination system 518 includes basically two separate illumination sources 546A, 546B that produce the source beams 548A, 548B, the single illumination optical assembly 550 that directs and focuses the beams, and the V-mirror 590 that directs the source beams 548A, 548B down a common optical path to the entrance of the illumination optical assembly.

Moreover, in this embodiment, the illumination sources 546A, 546B are similar to the illumination source 346 described above and illustrated in FIG. 3. Additionally, the illumination optical assembly 550 is similar to the illumination optical assembly 350 described above and illustrated in FIG. 3 without the grating. Thus, in this embodiment, the illumination optical assembly 550 includes a diffractive optical assembly 552, a collector optical assembly 554, a segmented imaging condenser assembly 556 (including the first lenslet array 562 and the second lenslet array 564), and a condenser optical assembly 560 that are similar to corresponding components described above.

It should be noted that when the two source beams 548A, 548B enter the illumination optical assembly 550 at off-axis positions, the images in the second fly's eye 564 are shifted by one lenslet from the first fly's eye 562. The result is that the images of the first lenslet array 562 are shifted at the mask 12 by one slit width. Moreover, as illustrated in FIG. 5, it should be noted that (i) the first source beam 548A is directed from the collector optical assembly 554 of the input optical assembly to the segmented imaging condenser assembly 556 at a first inclined angle 557A; and (ii) the second source beam 548B is directed from the collector optical assembly 554 to the segmented imaging condenser assembly 556 at a second inclined angle 557B. Further, as utilized herein, the term "inclined angle" signifies an angle at which the beam is not perpendicular to and/or normally incident on the segmented imaging condenser assembly 556.

It should also be noted that the conjugates 568, 570 are also illustrated in FIG. 5.

Figure 6:
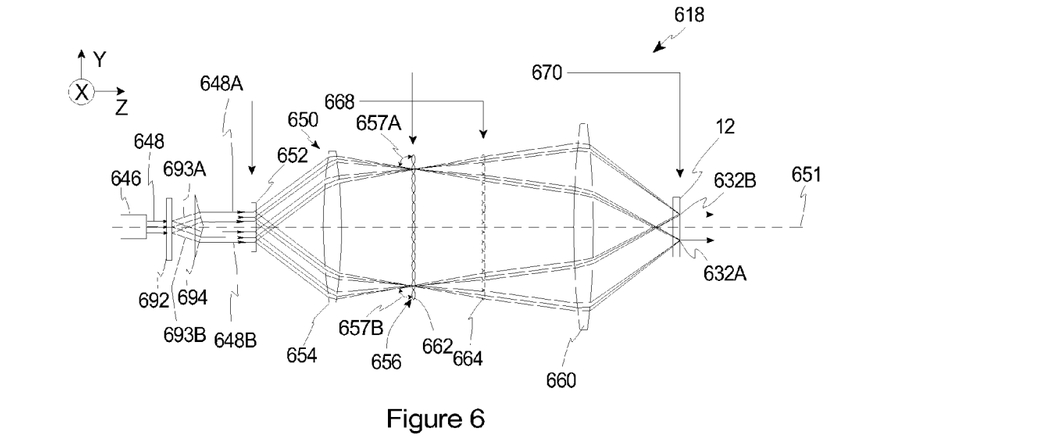
FIG. 6 is a simplified side illustration of a still another embodiment of an illumination system having features of the present invention.

FIG. 6 is a simplified side illustration of a yet another embodiment of an illumination system 618 that can be used in the exposure apparatus 10 of FIG. 1 to generate the first beam 632A and the second beam 632B that are simultaneously directed at two portions of the same mask 12. In this embodiment, the illumination system 618 includes (i) a illumination source 646 that emits a source beam 648 (illustrated with three arrows) of energy along the system axis 651, (ii) a beam splitter 692 that splits the source beam 648 into a first beam part 693A and a second beam part 693B, (iii) an illumination optical assembly 650 that directs and focuses the beam parts 693A, 693B, and (iv) a lens assembly 694 that directs the beam parts 693A, 693B at the illumination optical assembly 650.

In FIG. 6, the illumination source 646, the beam splitter 692, the lens assembly 694, and the illumination optical assembly 650 are aligned along the system axis 551. Further, in FIG. 6, (i) the beam parts 693A, 693B enter the illumination optical assembly 650 substantially parallel to and spaced apart on opposite sides of the system axis 651, and (ii) the illumination beams 632A, 632B, i.e. the first illumination beam 632A (also referred to herein simply as the "first beam") and the second illumination beam 632B (also referred to herein simply as the "second beam"), exit the illumination optical assembly 650 on opposite sides of the system axis 651.

In this embodiment, the illumination system 618 includes the illumination source 646 that produces the source beam 648, the beam splitter 692 that splits the source beam 648, and the single illumination optical assembly 650 that directs and focuses the beams.

Moreover, in this embodiment, the illumination source 646 is similar to the illumination source 346 described above and illustrated in FIG. 3. Additionally, the illumination optical assembly 650 is similar to the illumination optical assembly 350 described above and illustrated in FIG. 3 without the grating. Thus, in this embodiment, the illumination optical assembly 650 includes a diffractive optical assembly 652, a collector optical assembly 654, a segmented imaging condenser assembly 656 (including the first lenslet array 662 and the second lenslet array 664), and a condenser optical assembly 660 that are similar to corresponding components described above.

Further, in this embodiment, the beam splitter 692 can be similar in design to the grating 358 illustrated in FIG. 3 and described above. For example, the beam splitter 692 can be a diffraction grating, an array of prisms, a phase plate, or another type of beam splitter.

It should be noted that when the two source beams 648A, 648B, i.e. the first source beam 648A and the second source beam 648B, enter the illumination optical assembly 650 at off-axis positions, the images in the second fly's eye 664 are shifted by one lenslet from the first fly's eye 662. The result is that the images of the first lenslet array 662 are shifted at the mask 12 by one slit width. Moreover, as illustrated in FIG. 6, it should be noted that (i) the first source beam 648A is directed from the collector optical assembly 654 of the input optical assembly to the segmented imaging condenser assembly 656 at a first inclined angle 657A; and (ii) the second source beam 648B is directed from the collector optical assembly 654 to the segmented imaging condenser assembly 656 at a second inclined angle 657B.

It should also be noted that the conjugates 668, 670 are also illustrated in FIG. 6.

In some cases it may be desirable to be able to shutter the two slit images independently. This can be achieved in the case of FIG. 5 where the two sources 546A, 546B can be controlled separately with shutters or some other means. Alternatively, in any of the embodiments, the two slits may be shuttered in a conjugate to the reticle plane (at a reticle blind) and then relayed to the reticle.

Figure 7:
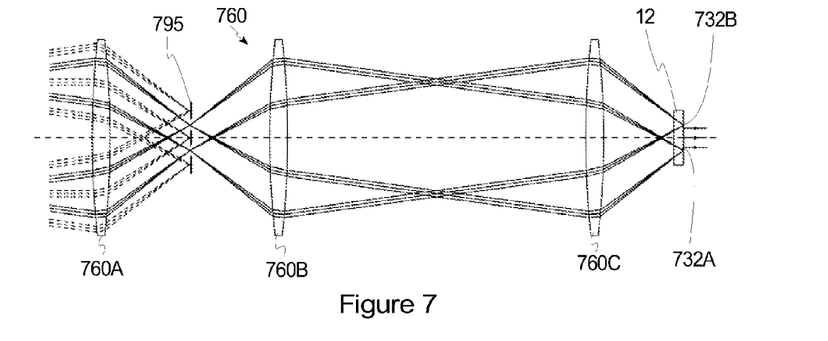
FIG. 7 is a simplified side illustration of a portion of an illumination system having features of the present invention.

FIG. 7 is a simplified illustration of a condenser optical assembly 760 and a spatial filter 795 that can be utilized in the illumination optical assemblies 350, 550, 650 illustrated in FIGS. 3, 5, and 6 and described above. In this embodiment, the condenser optical assembly 760 includes a first condenser lens 760A, a second condenser lens 760B, and a third condenser lens 760C that are spaced apart, and the spatial filter 795 is positioned between the first condenser lens 760A and a second collector lens 760B. Alternatively, the spatial filter 795 can be located at another position in or outside of the illumination optical assembly.

In FIG. 7, the spatial filer 795 blocks unwanted and stray light 799 (illustrated as dashed lines) from reaching the mask 12 while allowing the beams 732A, 732B to be directed at the mask 12. For example, the spatial filter 795 can include one or more fixed or movable blinds that are not transparent to the wavelength generated by the illumination source.

Figure 8A:
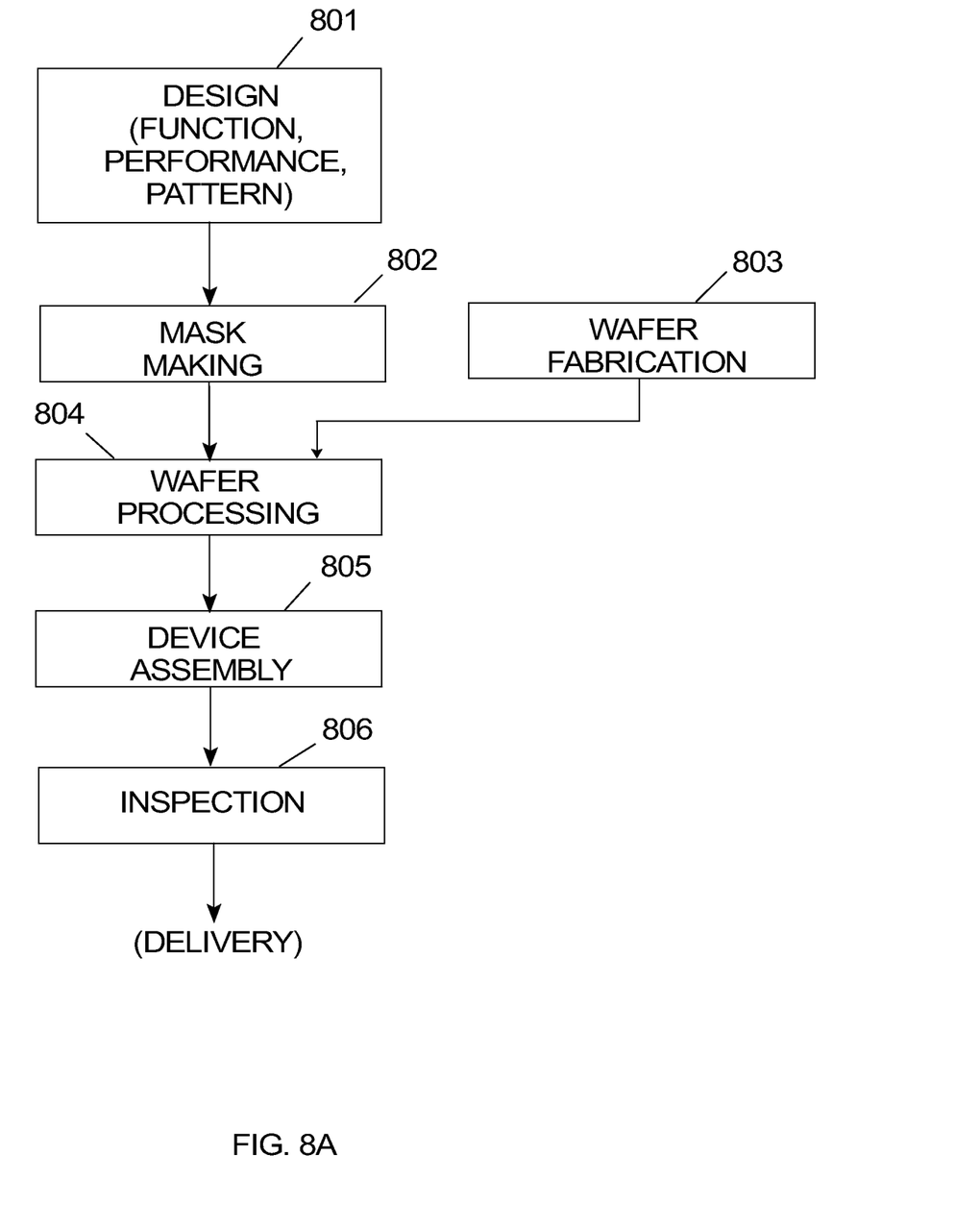
FIG. 8A is a flow chart that outlines a process for manufacturing a device in accordance with the present invention.

Semiconductor devices can be fabricated using the above described systems, by the process shown generally in FIG. 8A. In step 801 the device's function and performance characteristics are designed. Next, in step 802, a mask (reticle) having a pattern is designed according to the previous designing step, and in a parallel step 803 a wafer is made from a silicon material. The mask pattern designed in step 802 is exposed onto the wafer from step 803 in step 804 by a photolithography system described hereinabove in accordance with the present invention. In step 805, the semiconductor device is assembled (including the dicing process, bonding process and packaging process), finally, the device is then inspected in step 806.

Figure 8B:
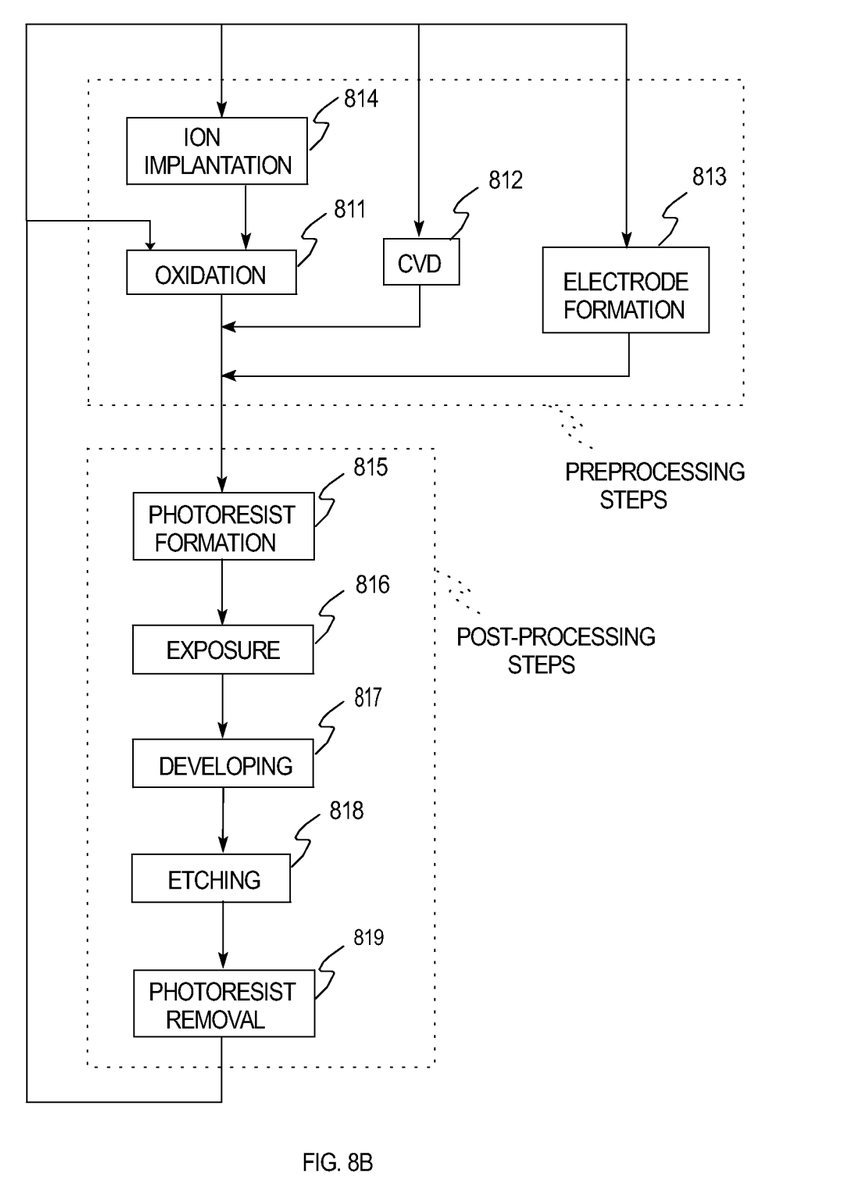
FIG. 8B is a flow chart that outlines device processing in more detail.

FIG. 8B illustrates a detailed flowchart example of the above-mentioned step 804 in the case of fabricating semiconductor devices. In FIG. 8B, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above mentioned steps 811-814 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 815 (photoresist formation step), photoresist is applied to a wafer. Next, in step 816 (exposure step), the above-mentioned exposure device is used to transfer the circuit pattern of a mask (reticle) to a wafer. Then in step 817 (developing step), the exposed wafer is developed, and in step 818 (etching step), parts other than residual photoresist (exposed material surface) are removed by etching. In step 818 (photoresist removal step), unnecessary photoresist remaining after etching is removed. Multiple circuit patterns are formed by repetition of these preprocessing and post-processing steps.

It is to be understood that the exposure apparatuses 10 disclosed herein are merely illustrative of the presently preferred embodiments of the invention and that no limitations are intended to the details of construction or design herein shown other than as described in the appended claims.

What is claimed is:

1. An exposure apparatus for transferring a mask pattern from a mask surface of a mask to at least one substrate, the exposure apparatus comprising:
    an illumination system that directs a first beam at the mask surface and a second beam at the same time at the mask surface, the illumination system comprising an input optical assembly and a segmented imaging condenser assembly, the segmented imaging condenser assembly includes a first lenslet array and a second lenslet array that is spaced apart from the first lenslet array,
    wherein the input optical assembly supplies a first source beam and a second source beam to the segmented imaging condenser assembly, each of the first source beam and the second source beam being directed through both the first lenslet array and the second lenslet array,
    wherein the first beam is generated from the first source beam,
    wherein the second beam is generated from the second source beam, and
    wherein a position of the first beam is different from a position of the second beam at the mask surface.

2. The exposure apparatus of claim 1 wherein the first beam and the second beam are each generally slit shaped.

3. The exposure apparatus of claim 1 wherein the first beam directed at the mask creates a first pattern beam that is transferred to a first substrate location and wherein the second beam directed at the mask creates a second pattern beam that is transferred to a second substrate location, and wherein the first substrate location is spaced apart from the second substrate location.

4. The exposure apparatus of claim 3 wherein the first pattern beam is transferred to a first substrate and wherein the second pattern beam is transferred to a second substrate.

5. The exposure apparatus of claim 1 wherein the illumination system includes an illumination source that generates a source beam, and a beam splitter that splits the source beam into the first source beam and the second source beam.

6. The exposure apparatus of claim 5 wherein the illumination system further comprises a lens assembly that directs the first source beam and the second source beam at the input optical assembly.

7. A process for manufacturing a first wafer and a second wafer that includes the steps of providing a first substrate, providing a second substrate, and transferring the mask pattern to the first substrate and the second substrate with the exposure apparatus of claim 1.

8. The exposure apparatus of claim 1 wherein the segmented imaging condenser assembly directs the first beam and the second beam.

9. The exposure apparatus of claim 1 wherein the first lenslet array includes a first fly's eye lens assembly and the second lenslet array includes a second fly's eye lens assembly.

10. The exposure apparatus of claim 1 wherein the illumination system further comprises a first illumination source that generates the first source beam, and a second illumination source that generates the second source beam.

11. The exposure apparatus of claim 10 wherein the illumination system further comprises a mirror that redirects the first source beam and the second source beam at the input optical assembly.

12. A method for transferring a mask pattern from a mask surface of a mask to at least one substrate, the method comprising the steps of:
retaining the mask;
supplying a first source beam and a second source beam with an input optical assembly to a segmented imaging condenser assembly within an illumination system, the segmented imaging condenser assembly including a first lenslet array and a second lenslet array that is spaced apart from the first lenslet array, each of the first source beam and the second source beam being directed through both the first lenslet array and the second lenslet array; and
directing a first beam that is generated from the first source beam and a second beam that is generated from the second source beam at the same time at the mask surface with the illumination system, wherein a position of the first beam is different from a position of the second beam at the mask surface.

13. The method of claim 12 wherein the first beam directed at the mask creates a first pattern beam that is transferred to a first substrate location and wherein the second beam directed at the mask creates a second pattern beam that is transferred to a second substrate location, and wherein the first substrate location is spaced apart from the second substrate location.

14. The method of claim 12 further comprising the steps of generating a source beam with an illumination source, and splitting the source beam into the first source beam and the second source beam.

15. The method of claim 14 further comprising the step of directing the first source beam and the second source beam at the input optical assembly with a lens assembly.

16. A method for manufacturing a first wafer and a second wafer that includes the steps of providing a first substrate, providing a second substrate, and transferring the mask pattern to the first substrate and the second substrate by the method of claim 12.

17. The method of claim 12 wherein the step of directing includes the step of directing the first beam and the second beam with the segmented imaging condenser assembly.

18. The method of claim 12 wherein the step of supplying the first source beam and the second source beam includes the first lenslet array including a first fly's eye lens assembly and the second lenslet array including a second fly's eye lens assembly.

19. The method of claim 12 further comprising the steps of generating the first source beam with a first illumination source, and generating the second source beam with a second illumination source.

20. The method of claim 19 further comprising the step of redirecting the first source beam and the second source beam at the input optical assembly with a mirror.

* * * * *